US007790617B2

United States Patent
Lim et al.

(10) Patent No.: US 7,790,617 B2
(45) Date of Patent: Sep. 7, 2010

(54) FORMATION OF METAL SILICIDE LAYER OVER COPPER INTERCONNECT FOR RELIABILITY ENHANCEMENT

(75) Inventors: Yeow Kheng Lim, Singapore (SG); Wei Lu, Singapore (SG); Liang Choo Hsia, Singapore (SG); Jyoti Gupta, Singapore (SG); Chim Seng Seet, Singapore (SG); Hao Zhang, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 156 days.

(21) Appl. No.: 11/273,108

(22) Filed: Nov. 12, 2005

(65) Prior Publication Data

US 2007/0111522 A1  May 17, 2007

(51) Int. Cl.
  *H01L 21/441* (2006.01)
(52) U.S. Cl. ............... 438/687; 438/682; 438/683; 438/684; 438/688; 257/E21.296; 257/E21.537; 257/E21.538
(58) Field of Classification Search ............... 438/682, 438/683, 684, 687, 688; 257/E21.296, E21.537–538
  See application file for complete search history.

(56) References Cited

U.S. PATENT DOCUMENTS

| 5,447,887 | A | 9/1995 | Filipiak et al. |
| 5,510,295 | A | 4/1996 | Cabral, Jr. et al. |
| 5,893,752 | A | 4/1999 | Zhang |
| 6,181,013 | B1 * | 1/2001 | Liu et al. ............ 257/762 |
| 6,660,634 | B1 | 12/2003 | Ngo et al. |
| 6,674,167 | B1 | 1/2004 | Ahn et al. |
| 6,777,811 | B2 | 8/2004 | Harada |
| 6,927,160 | B1 * | 8/2005 | Kitch ............ 438/631 |
| 7,323,758 | B2 * | 1/2008 | Niisoe et al. ............ 257/435 |
| 2002/0102849 | A1 * | 8/2002 | Yi et al. ............ 438/682 |
| 2003/0205810 | A1 * | 11/2003 | Usami ............ 257/751 |
| 2006/0249850 | A1 * | 11/2006 | Erturk et al. ............ 257/775 |
| 2007/0085209 | A1 * | 4/2007 | Lu et al. ............ 257/758 |

OTHER PUBLICATIONS

Godbole, silicon to tungsten ratio determination in tungsten silicide using XRF, IEEE 2001, pp. 46-50.*

* cited by examiner

*Primary Examiner*—Kiesha R Bryant
*Assistant Examiner*—Minchul Yang
(74) *Attorney, Agent, or Firm*—Horizon IP Pte Ltd

(57) ABSTRACT

A method of fabrication of a sputtered metal silicide layer over a copper interconnect. We form a dielectric layer over a conductive layer. We form an interconnect opening in the dielectric layer. We form a copper layer at least filling the interconnect opening. We planarize the copper layer to form a copper interconnect in the interconnect opening. The copper interconnect is over polished to form a depression. We form metal silicide layer over the copper interconnect using a low temperature sputtering process. We can form a cap layer over the metal silicide layer.

29 Claims, 3 Drawing Sheets

FORMATION OF METAL SILICIDE LAYER OVER COPPER INTERCONNECT FOR RELIABILITY ENHANCEMENT

BACKGROUND OF INVENTION

1) Field of the Invention

The present invention relates to copper (Cu) and/or Cu alloy metallization in semiconductor devices. The present invention is applicable to manufacturing high speed integrated circuits having submicron design features and high conductivity interconnect structures.

2) Description of the Prior Art

Typically, Cu interconnects are fabricated using damascene processing methods. In these structures, the top surface of the Cu damascene line is capped with a thin dielectric layer, e.g. $Si_3N_4$, SiC, etc, while the bottom surface and two sidewalls are sealed with a metal liner, e.g. TiN, Ta, TaN, etc. Although the fast diffusion paths in Cu interconnect can vary depending on the fabrication process and materials used, all investigators have reported that the electromigration lifetime of Cu transport at interfaces, especially the Cu/dielectric interface. Even though, this interface allows fast diffusion, interjecting a thin conducting layer on the surface of Cu line shows to reduce Cu interface mass transport and enhances Cu electromigration (EM) lifetime.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,777,811: —Harada—Semiconductor device and its fabrication method—Semiconductor device has copper silicide layer formed selectively on copper wiring above which titanium nitride film is deposited inside a hole formed in silicon oxide and silicon nitride films.

U.S. Pat. No. 6,181,013—Liu, Chung-Shi—Method for selective growth of Cu3Ge or Cu5Si for passivation of damascene copper structures and device manufactured thereby—Thin film electronic device for use in ultra large scale integrated applications includes a passivation layer overlying an exposed surface of a damascene copper conductor.

U.S. Pat. No. 5,893,752: —Inventor: Zhang, Jiming; Austin, Tex. —Process for forming a semiconductor device—Manufacture of a semiconductor device with metal interconnects U.S. Pat. No. 6,660,634 Ngo, et al. Dec. 9, 2003—Method of forming reliable capped copper interconnects.

U.S. Pat. No. 5,447,887 Filipiak, et al. Sep. 5, 1995—Method for capping copper in semiconductor devices.

U.S. Pat. No. 6,674,167 Ahn, et al. Jan. 6, 2004—Multi-level copper interconnect with double passivation—forms a silicide layer around the cu interconnects.

U.S. Pat. No. 5,510,295 Cabral, Jr., et al. shows a process to make metal silicide.

SUMMARY OF THE INVENTION

The embodiments of the present invention provides a structure and a method of manufacturing a copper interconnect with an overlying sputtered metal silicide which is characterized as follows.

An example embodiment comprises:
  forming a dielectric layer over a semiconductor structure;
  forming an interconnect opening in said dielectric layer;
  forming a copper layer at least filling said interconnect opening;
  planarizing said copper layer to form a copper interconnect in said interconnect opening; said copper interconnect has a top surface below the top surface of the surrounding dielectric layer;
    forming metal silicide layer over said copper interconnect using a sputter process;
  planarizing said metal silicide layer to form a metal silicide cap.

In an aspect, the metal silicide layer is formed using a sputter process at a temperature between 20 and 180 degrees C.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

I. Example Embodiment of a Silicide Layer Over a Copper Interconnect

An example embodiment is shown in FIGS. 1 to 5 for a method of fabrication of a low temperature sputtered metal silicide layer over a copper interconnect.

A. Form a Conductive Layer and Capping Layer Over a Semiconductor Structure

Figure 1:
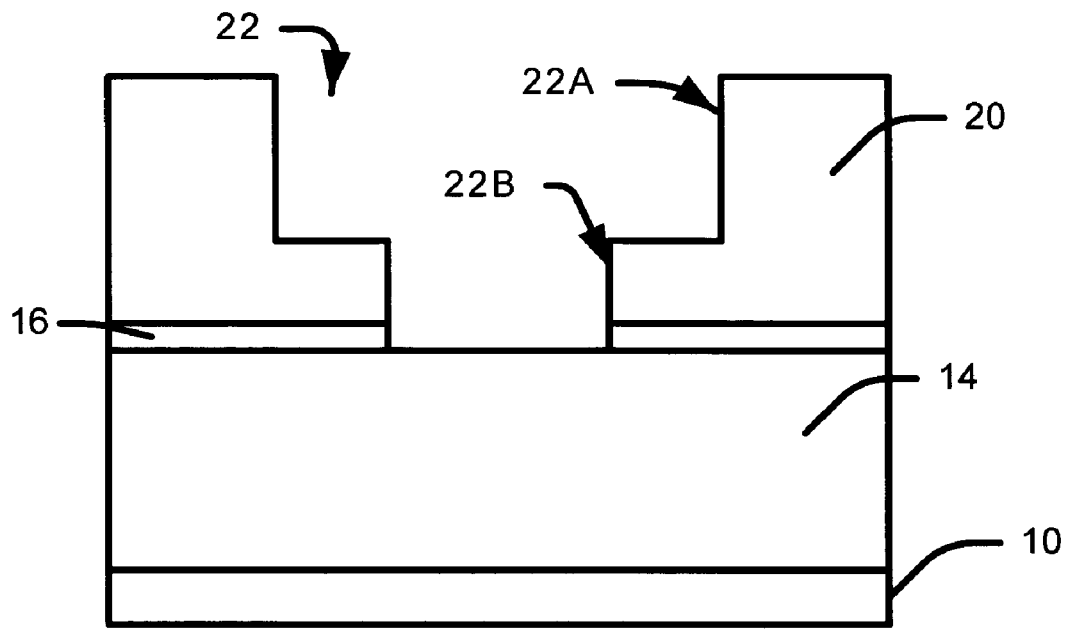
FIGS. 1 through 5 are cross sectional views for illustrating a method for manufacturing a sputtered metal silicide layer on a copper interconnect according to an example embodiment of the present invention.

Referring to FIG. 1, we form a conductive layer 14 over a semiconductor structure 10. The semiconductor structure can comprise a substrate having conductive and insulating layers there over. The conductive layer 14 can be a metal layer, such as a copper layer. The substrate can be a semiconductor substrate such as a silicon wafer. The substrate can be other substrates used in electronics' manufacturing.

Next, we form a capping layer 16 over the conductive layer 16.

The capping layer can be comprised dielectric materials and more preferably of SiN, SiC(O), SiC(N), and combination of SiC(O) and SiC(N).

B. Form Interconnect Opening in Dielectric Layer

Next, we form a dielectric layer 20 over the barrier layer 16 and the conductive layer 14.

The dielectric layer 20 can be comprised of dielectric materials and more preferably TEOS or low K material; and has a thickness between 2000 and 6000 angstroms and more preferably a thickness between 3000 and 5000 Angstroms.

C. Interconnect Opening

Then we form an interconnect opening 22 in the dielectric layer 20.

The interconnect opening 22 can have a single or dual damascene shape.

For example, for a dual damascene opening 22, the trench (upper) opening 22A can have an open dimension between 0.05 and 0.8 microns and more preferably between 0.1 and 0.6 microns and the via opening (lower) 22B can have an open dimension between 0.05 and 0.6 μm and more preferably between 0.1 and 0.3 μm.

D. Forma Copper Layer

Figure 2:
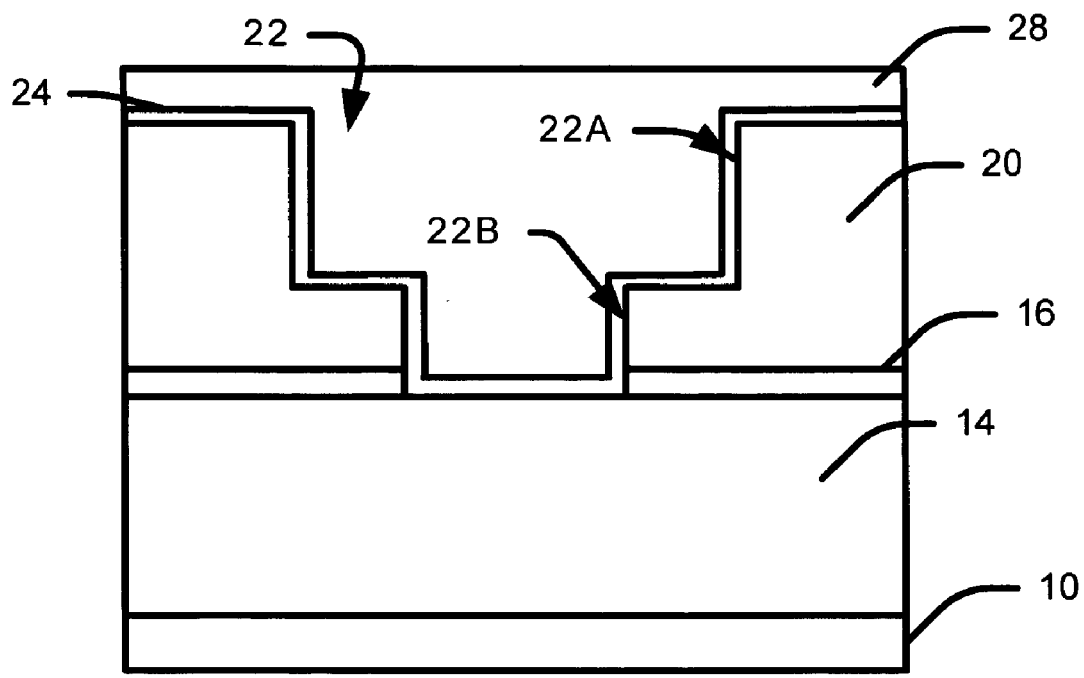

Referring to FIG. 2, we form a copper layer at least filling the interconnect opening 22.

In an example process, the copper layer can be formed by the following steps. A pore sealant can be formed selectively over the dielectric layer 20 in the interconnect opening 22. The pore sealant is comprised of any dielectric material and more preferably of SiN, Parylene-N or Poly(p-xylyene).

Next we form a barrier layer 24 over the dielectric layer 20.

The barrier layer 24 can be comprised of TiN or TiSiN, Ta, TaN or a combination of Ta/TaN and can have a thickness between 50 and 500 angstroms and more preferably 150 and 200 angstroms.

We form a Cu seed layer over the barrier layer 24. The Cu seed layer is preferably a PVD Cu layer with a thickness between 200 and 1000 angstroms and more preferably between 300 and 600 angstroms.

Then we can form a Cu layer 28 by an electroplating process (such as ECP® System process by AMC research INC., USA) over the seed layer thus at least filling the interconnect opening.

The copper layer 28 can be formed by a electroplating or electroless process and is most preferably formed by an electroplating process.

E. Copper Interconnect

Figure 3:
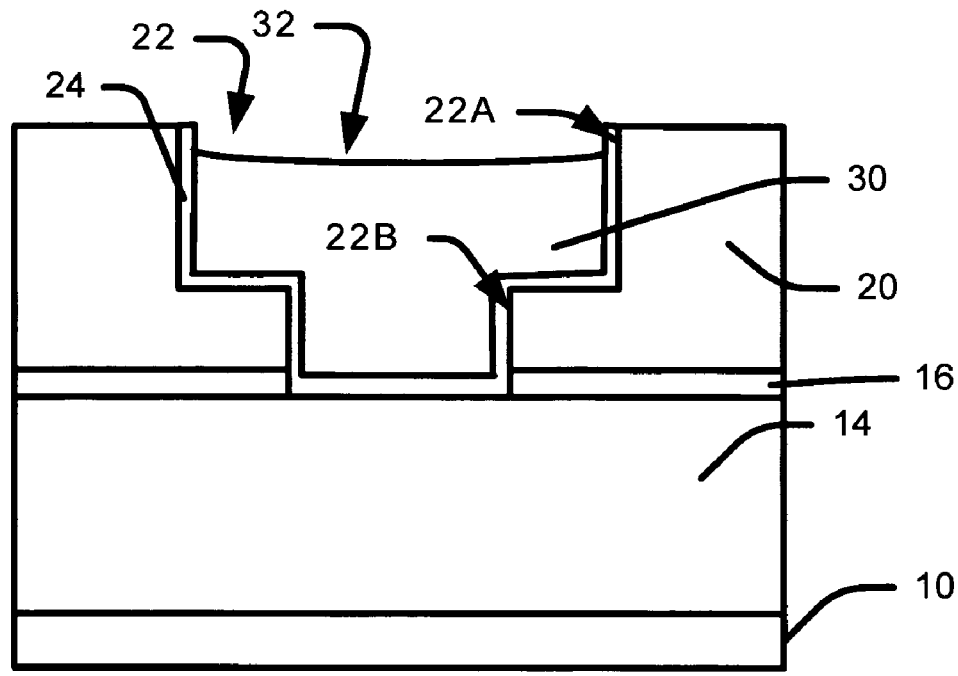

As shown in FIG. 3, we planarize the copper layer 28 to form a copper interconnect 30 in the interconnect opening 22. The planarization process can be a chemical-mechanical polish (CMP) or Electrochemical Mechanical Planarization (ECMP) process.

The step of planarizing the copper layer 28 removes the copper layer over the top surface of the dielectric layer 20 outside of the interconnect opening 22 and removes the barrier metal layer 24 outside of the interconnect opening 22. We preferably purposely over polish the copper interconnect 28 to a level below the top surface of the dielectric layer outside of the interconnect opening 22 to create a depression 32. This over polishing causes dishing. Preferably we over polish the interconnect 28 to form the depression 32 that has a top level between 100 and 300 angstroms and more preferably between 100 and 200 angstroms below the top surface of the dielectric layer 20.

F. Metal Silicide Layer by Low Temperature Sputtering Process

Figure 4:
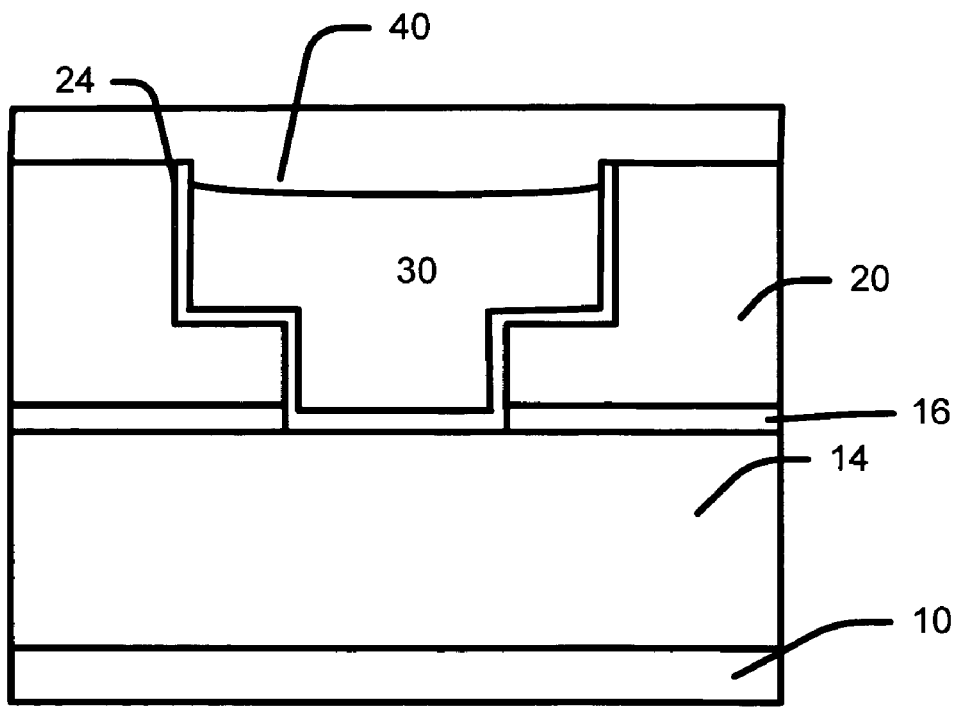

Referring to FIG. 4, in a key step, we form metal layer or metal silicide layer 40 over the copper interconnect using a sputtering process.

Preferably we treat the Cu 30 surface before we form the metal silicide layer 40. Preferably, after the Cu CMP, we expose the copper surface to air to form a Copper oxide layer on the top surface of the Cu. It is preferably to subject the Cu surface to a $NH_3$ or $H_2$ containing plasma treatment for 5 to 25 seconds and more preferably 10 to 20 seconds.

The metal silicide layer 40 can be comprised of a metal silicide such as WSi (tungsten silicide), CoSi (cobalt silicide), NiSi (nickel silicide), CuSi (copper silicide) and is most preferably comprised of NiSi or CuSi. The sputter target is an alloyed metal silicide. The metal silicide sputter process is preferably performed at a temperature between 20 and 180 C.

Tungsten Silicide

An example metal silicide sputter process is as follows:
sputter target preferably is comprised substantially of a silicon and tungsten with a Si/W atomic ratio of between 2.7 and 2.9. (e.g., Si/W atomic ratio of 2.8+/−0.1). Where Si/W is the atomic ratio of Si to tungsten.

DC power for sputtering is between 1000 to 3000 W,

Ar gas as sputtering gas pressure less than 10 mtorr.

temperature between 20 and 180 C

Sputtering in a PVD chamber equipped with heating pedestal set at temp between about 20 C and 180 C, Depending on the application typically sputtered silicide is for blanket deposition then is not need to bias power to improve step coverage of the deposited film.

The metal silicide layer 40 is preferably comprised of substantially of silicon and tungsten and preferably has a Si/W atomic ratio of between 2.7 and 2.9 (Si/W atomic ratio of 2.8+/−0.1). In other words, Si/W is the atomic ratio of Si to tungsten.

Copper Silicide

Another example is a copper silicide (CuSi) sputter process is as follows:
sputter target preferably comprised substantially of a silicon and Cu with a Si/Cu atomic ratio of between 2.7 and 2.9. (e.g., Si/Cu atomic ratio of 2.8 +/−0.1). Where Si/Cu is the atomic ratio of Si to tungsten.

DC power for sputtering is between 1000 to 3000 W,

Ar gas as sputtering gas pressure less than 10 mtorr.

temperature between 20 and 180 C

Sputtering in a PVD chamber equipped with heating pedestal set at temp between about 20 C and 180 C, Depending on the application typically sputtered silicide is for blanket deposition then is not need to bias power to improve step coverage of the deposited film.

The metal silicide layer 40 also is preferably comprised of substantially of silicon and copper (copper silicide) and preferably has a Si/Cu atomic ratio of between 2.7 and 2.9 (Si/Cu atomic ratio of 2.8+/−0.1). In other words, Si/Cu is the atomic ratio of Si to Cu.

The metal silicide layer 40 can have a thickness between 500 and 800 angstroms.

G. Optional—Annealing the Metal Silicide Layer

In an optional step, we can anneal the metal silicide layer 40.

H. Planarizing the Metal Silicide Layer

Figure 5:
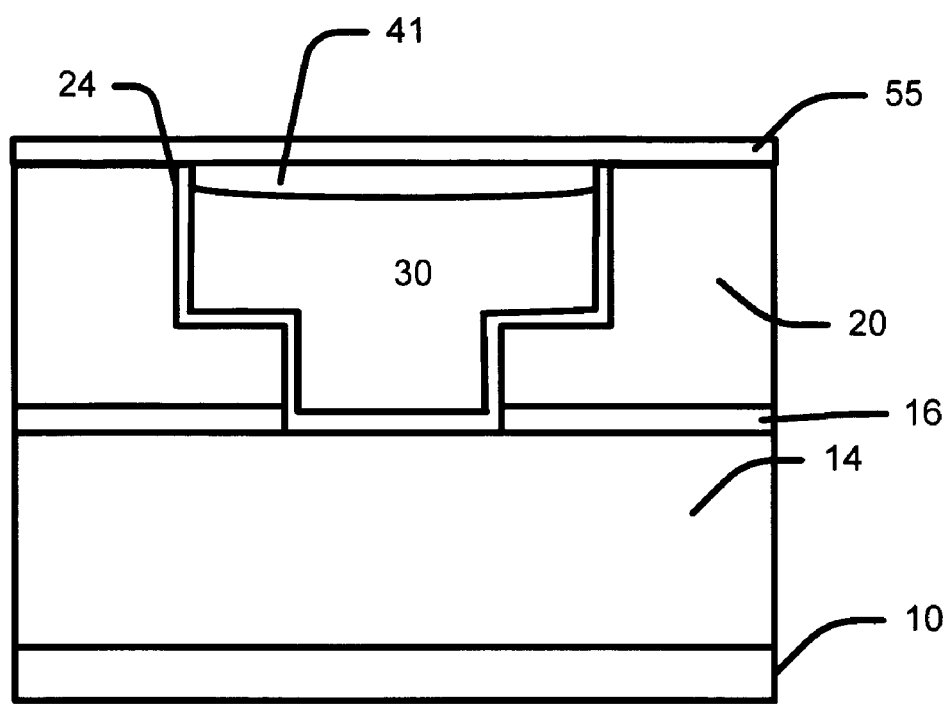

Referring to FIG. 5, we planarize the metal silicide layer 40 to form a metal silicide cap 41. The metal silicide cap preferably has a thickness between 100 and 200 angstroms.

Next, we can form a dielectric capping layer 55 over the metal silicide cap 41.

I. Cap Layer

Referring to FIG. 5, we form a cap layer 55 over the metal silicide cap 41 and dielectric layer 20. The cap layer 50 can be comprised of dielectric materials and more preferably of SiN, SiC(O), Si(N), and combination of SiC(O) and SiC(N).

J. Example Embodiment—Spuffer Metal Silicide Process

In the embodiment's process, metal silicide (e.g. CuSi, CoSi, NiSi, etc) is deposited on Cu by physical sputtering of sintering target at lower temperature preferably between 20 C and 180 degrees C. In contrast, it is common to form CuSi by reactive method such as forming a silicon layer on a metal layer an perform an anneal at between 300 and 450 C. The reactive process is at a much higher temperature which is not favorable for Cu process. High temperatures such as this can cause via pull out that can lead to void formation between the via bottom and the underlying metal. Thus yield can significantly decrease. The embodiment's low temperature sputter metal silicide cap process can improve yields by reducing temperature related defects (e.g, via pull out, voids, etc).

K. Non—Limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming an interconnect comprising:
providing an interconnect dielectric layer on a substrate of a semiconductor structure, the interconnect dielectric layer having a top surface;
providing an interconnect opening in the interconnect dielectric layer;
forming an interconnect in the interconnect opening with the top surface of the interconnect dielectric layer exposed, the interconnect having an interconnect top surface below the top surface of the interconnect dielectric layer to form a recess in the interconnect opening;
treating the interconnect top surface, wherein the treating comprises forming an oxide layer on the interconnect top surface in the opening; and
after treating the interconnect top surface, forming a blanket metal silicide layer on the exposed top surface of the interconnect dielectric layer and filling the recess using a non-reactive process, wherein the non-reactive process improves interconnect reliability.

2. The method of claim 1 which further includes planarizing the metal silicide layer to expose the top surface of the dielectric layer and to form a metal silicide cap in the recess.

3. The method of claim 1 wherein the low temperature process comprises a sputter process performed at a temperature between about 20 and 180 degrees C.

4. The method of claim 1 further comprises planarizing the metal silicide layer to form a metal silicide cap in the recess, the metal silicide cap has a thickness between about 100 and 200 angstroms, and the metal silicide layer is comprised of a material selected from the group consisting of WSi, CoSi, NiSi, and CuSi or a combination thereof.

5. The method of claim 1 wherein the dielectric layer comprises a low k dielectric material.

6. A method of forming an interconnect comprising:
forming a dielectric layer on a substrate, the dielectric layer serves as an interlevel dielectric in which an interconnect is formed, the dielectric layer is prepared with an interconnect opening;
depositing a conductive interconnect layer over the dielectric layer and at least filling the interconnect opening;
polishing the substrate, wherein polishing removes excess conductive interconnect material to expose a top surface of the dielectric layer and recesses the interconnect material to form a recess in the interconnect opening such that a top surface of the interconnect material is below the top surface of the dielectric layer;
treating a surface of the interconnect material by forming an oxide layer of the interconnect material on the top surface of the interconnect material in the interconnect opening;
after treating the surface, forming a blanket metal silicide layer on the exposed top surface of the dielectric layer and filling the recess using a low temperature process with temperatures at about 180 degrees C. or lower, wherein avoiding the use of a high-temperature chemical reactive process improves interconnect reliability; and
planarizing the metal silicide layer to expose the top surface of the dielectric layer and to form a metal silicide cap in the recess.

7. The method of claim 6 wherein:
the dielectric layer is comprised of TEOS or a low K material and has a thickness between 2000 and 6000 angstroms; and
the interconnect opening comprises a dual damascene opening.

8. The method of claim 6 wherein the conductive interconnect layer comprises copper (Cu) and depositing the conductive interconnect layer comprises:
forming a pore sealant selectively over the dielectric layer in the interconnect opening, the pore sealant is comprised of SiN, Parylene-N or Poly(p-xylyene);
forming a barrier layer over the dielectric layer, the barrier layer comprised of a material from the group consisting of TiN, TiSiN, Ta and TaN, or a combination thereof having a thickness between about 150 and 300 angstroms;

forming a Cu seed layer over the barrier layer, the Cu seed layer is a PVD Cu layer with a thickness between about 300 and 600 angstroms; and forming the copper layer by an electroplating process over the seed layer.

9. The method of claim 6 wherein:
planarizing comprises chemical mechanical polishing; and
the recess is between about 100 and 200 angstroms below the top surface of the dielectric layer.

10. The method of claim 6 wherein the recess is between about 100 and 200 angstroms below the top surface of the dielectric layer.

11. The method of claim 6 wherein:
forming an oxide layer of the interconnect material comprises exposing the interconnect material to air; and
treating the surface of the interconnect material with a plasma process.

12. The method of claim 6 wherein the metal silicide layer is comprised of a material selected from the group consisting of WSi, CoSi, NiSi and CuSi, or a combination thereof.

13. The method of claim 6 wherein said metal silicide layer has a thickness between about 500 and 800 angstroms.

14. The method of claim 6 wherein the low temperature process is a sputtering process and comprises:
a target comprised substantially of metal and Si with a Si/Metal atomic ratio of between 2.7 and 2.9;
a DC power for sputtering is between 1000 to 3000 W;
Ar gas as sputtering gas;
a pressure less than 10 mtorr; and
a temperature between 20 and 180 degrees C.

15. The method of claim 6 wherein the metal silicide cap has a thickness between about 100 and 200 angstroms.

16. The method of claim 6 wherein:
the low temperature process comprises a sputter process at a temperature between about 20 and 180 degree C.; and
the metal silicide layer is comprised substantially of copper silicide.

17. A method of forming an interconnect comprising:
providing a substrate prepared with a dielectric layer in which an interconnect is formed;
forming an interconnect opening in the dielectric layer, the interconnect opening comprising a dual damascene opening;
forming a copper layer at least filling the interconnect opening, wherein
the copper layer is formed by an electroplating or electroless process;
planarizing the copper layer to expose a top surface of the dielectric layer and to form a copper interconnect in the interconnect opening, the copper interconnect having a top surface between about 100 and 300 angstroms below the top surface of the dielectric layer to form a recess in the interconnect opening;
treating a surface of the copper interconnect which include
forming a copper oxide layer on the surface of the copper interconnect in the interconnect opening, and
performing a plasma treatment on the surface of the interconnect;
after treating the surface of the interconnect, forming a metal silicide layer over the copper interconnect using a sputter process, wherein the metal silicide layer is formed using a sputter process at a temperature between about 20 and 180 degree C.,
the metal silicide layer is comprised of a material selected from the group consisting of WSi, CoSi, NiSi and CuSi, or a combination thereof;

planarizing said metal silicide layer to expose the top surface of the dielectric layer and to form a metal silicide cap in the recess.

18. The method of claim 17 which further includes forming a cap layer over the metal silicide cap and dielectric layer, the cap layer is comprised of a material selected from the group consisting of dielectric materials SiN, SiC(O) and SiC(N).

19. The method of claim 17 wherein forming the copper layer comprises:
forming a pore sealant selectively over the dielectric layer in the interconnect opening, the pore sealant is comprised of SiN, Parylene-N or Poly(p-xylyene);
forming a barrier layer over the dielectric layer, the barrier layer comprised of a material from the group consisting of TiN, TiSiN, Ta, TaN, or a combination thereof and has a thickness between about 150 and 200 angstroms;
forming a Cu seed layer over the barrier layer, the Cu seed layer is a PVD Cu layer with a thickness between about 50 and 500 angstroms; and
forming said copper layer by an electroplating process over the Cu seed layer.

20. The method of claim 19 wherein the sputtering process further comprising:
a target comprised substantially of metal and Si with a Si/W atomic ratio of between 2.7 and 2.9;
a DC power for sputtering is between 1000 to 3000 W;
Ar gas as sputtering gas; and
a pressure less than 10 mtorr.

21. The method of claim 17 wherein the metal silicide layer comprised substantially of copper silicide and is formed using a sputtering process further comprising:
a target comprised substantially of copper and Si with a Si/Cu atomic ratio of between 2.7 and 2.9;
a DC power for sputtering is between 1000 to 3000 W;
Ar gas as sputtering gas; and
a pressure less than 10 mtorr.

22. The method of claim 17 wherein the metal silicide cap has a thickness between 100 and 200 angstroms.

23. A method of forming an integrated circuit comprising:
providing a substrate prepared with a dielectric layer in which an interconnect is formed, the dielectric layer is prepared with an opening, the dielectric layer having a top surface;
filling the opening with a conductive layer, wherein the top surface of the dielectric layer is exposed and the conductive layer comprises a top surface below the top surface of the dielectric layer to form a recess in the opening;
forming an interconnect cap in the recess with the top surface of the dielectric layer exposed, the interconnect cap is formed using a non-reactive process, wherein the non-reactive process improves interconnect reliability; and
treating the top surface of the conductive layer prior to forming the interconnect cap, wherein the treating comprises,
forming an oxide layer on the top surface of the conductive layer in the opening, and
performing a plasma treatment on the top surface of the conductive layer.

24. The method of claim 23 wherein the interconnect cap comprises metal silicide cap.

25. The method of claim 23 wherein the conductive layer comprises copper.

26. The method of claim 25 wherein the interconnect cap comprises metal silicide cap.

27. The method of claim 23 wherein filling the opening comprises:

depositing a conductive layer comprising a conductive material; and polishing the conductive layer to remove excess conductive material to form the recess in the opening and to expose the top surface of the dielectric layer.

28. The method of claim 23 wherein forming the interconnect cap comprises:

sputtering a cap layer on the substrate to cover the exposed top surface of the dielectric layer and filling the recess; and polishing to remove excess material from the cap layer to expose the top surface of the dielectric layer and to form the interconnect cap in the recess.

29. The method of claim 28 wherein filling the opening comprises:

depositing a conductive layer comprising a conductive material; and polishing the conductive layer to remove excess conductive material to form the recess in the opening and to expose the top surface of the dielectric layer.

* * * * *